(12) United States Patent
Sato et al.

(10) Patent No.: US 8,963,324 B2
(45) Date of Patent: Feb. 24, 2015

(54) SEMICONDUCTOR DEVICE

(71) Applicants: Takato Sato, Toyota (JP); Yukio Onishi, Nagoya (JP); Hiroyuki Kono, Nagoya (JP); Hiroaki Yoshizawa, Toyota (JP); Toshio Watari, Toyota (JP); Hiromi Yamasaki, Toyota (JP)

(72) Inventors: Takato Sato, Toyota (JP); Yukio Onishi, Nagoya (JP); Hiroyuki Kono, Nagoya (JP); Hiroaki Yoshizawa, Toyota (JP); Toshio Watari, Toyota (JP); Hiromi Yamasaki, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 14/225,519

(22) Filed: Mar. 26, 2014

(65) Prior Publication Data

US 2014/0291833 A1 Oct. 2, 2014

(30) Foreign Application Priority Data

Apr. 2, 2013 (JP) ................. 2013-077106

(51) Int. Cl.
*H01L 23/34* (2006.01)
*H01L 23/40* (2006.01)
*H01L 23/367* (2006.01)

(52) U.S. Cl.
CPC ............ *H01L 23/40* (2013.01); *H01L 23/3672* (2013.01)
USPC ................... 257/719; 257/E23.103; 257/718; 257/726; 257/727; 438/117; 438/122

(58) Field of Classification Search
CPC ................ H01L 2924/01029; H01L 24/72; H01L 2924/01013
USPC ................. 257/E23.103, E23.105, 706, 707, 257/718–720, 722, 726, 727, 796; 438/117, 438/122, 124–127
See application file for complete search history.

(56) References Cited

U.S. PATENT DOCUMENTS

| | | | | |
|---|---|---|---|---|
| 5,424,919 A * | 6/1995 | Hielbronner | ............... | 361/710 |
| 5,646,826 A * | 7/1997 | Katchmar | .................... | 361/704 |
| 5,705,850 A * | 1/1998 | Ashiwake et al. | .......... | 257/714 |
| 5,883,782 A * | 3/1999 | Thurston et al. | ............ | 361/704 |
| 6,386,890 B1 * | 5/2002 | Bhatt et al. | ..................... | 439/67 |
| 6,472,742 B1 * | 10/2002 | Bhatia et al. | .................. | 257/713 |
| 6,483,708 B2 * | 11/2002 | Ali et al. | ........................ | 361/719 |
| 6,631,078 B2 * | 10/2003 | Alcoe et al. | .................. | 361/719 |
| 6,885,557 B2 * | 4/2005 | Unrein | ......................... | 361/704 |
| 7,187,553 B2 * | 3/2007 | Schmidberger | ............... | 361/719 |
| 7,361,985 B2 * | 4/2008 | Yuan et al. | ................... | 257/713 |
| 7,518,235 B2 * | 4/2009 | Coico et al. | ................... | 257/719 |
| 7,777,329 B2 * | 8/2010 | Colbert et al. | ................ | 257/719 |
| 7,795,724 B2 * | 9/2010 | Brodsky et al. | .............. | 257/712 |
| 7,957,148 B1 * | 6/2011 | Gallarelli et al. | ............ | 361/719 |
| 7,978,475 B2 * | 7/2011 | Urai | .............................. | 361/719 |
| 2010/0127391 A1 * | 5/2010 | Hasegawa | .................... | 257/719 |

* cited by examiner

*Primary Examiner* — Chris Chu
(74) *Attorney, Agent, or Firm* — Oliff PLC

(57) ABSTRACT

In a semiconductor device, a semiconductor module is pressed against a cooler by a spring member. The spring member is compressed by a beam member that is connected with a strut fixed to the cooler. The cooler has a pressed part in which the semiconductor module is pressed, and a strut fixing part to which the strut is fixed. The strut fixing part has higher rigidity than the pressed part.

5 Claims, 6 Drawing Sheets

RELATED ART

SEMICONDUCTOR DEVICE

INCORPORATION BY REFERENCE

The disclosure of Japanese Patent Application No. 2013-077106 filed on Apr. 2, 2013 including the specification, drawings and abstract is incorporated herein by reference in its entirety.

BACKGROUND OF THE INVENTION

1. Field of the Invention

The present invention relates to a semiconductor device.

2. Description of Related Art

A semiconductor device such as an IGBT (an insulated gate bipolar transistor) and an IPM (an intelligent power module) is provided with a semiconductor module including a semiconductor element, and a cooler. In order to enhance cooling performance, grease for cooling is applied on a surface between the semiconductor module and the cooler. Flatness is varied in this surface. Therefore, from the viewpoint of cooling performance, given contact pressure is required inside the surface in order to arrange the grease evenly inside the surface and also to reduce a thickness of the grease as much as possible.

Therefore, Japanese Patent Application Publication 2007-329167 A (JP 2007-329167 A) stated below describes a structure that includes a spring, and a beam fixed by struts corresponding to a plurality of screws. In this structure, a semiconductor module is pressed against a cooler by holding force applied by the beam using a spring load.

However, in the related art described in JP 2007-329167 A stated above, when the holding force is increased in order to reduce a distance between the semiconductor module and the cooler, the cooler is deformed following the holding force, thus tilting the struts. The tilt of the struts may cause deterioration of cooling performance because given contact pressure is not obtained. As a result, accuracy of dimensions such as accuracy of heights, positions, and so on of the device can be decreased.

SUMMARY OF THE INVENTION

The present invention provides a semiconductor device that is able to realize higher cooling performance and accuracy of dimensions.

A semiconductor device according to an aspect of the present invention includes a semiconductor module, a cooler, a spring member, a strut, and a beam member. The spring member is configured to press the semiconductor module against the cooler. The strut is fixed to the cooler. The beam member is connected with the strut, and configured to compress the spring member. The cooler includes a pressed part to which the semiconductor module is pressed, and a strut fixing part to which the strut is fixed. The strut fixing part has higher rigidity than the pressed part. The cooler may include a cooling fin. Dimensional data of a part of the cooling fin located in a region corresponding to the strut fixing part may be different from dimensional data of a part of the cooling fin located in a region corresponding to the pressed part.

The aspect of the present invention improves a capability of the cooler for following pressing of the pressed part. Therefore, grease is arranged evenly and more thinly on a surface between the cooler and the semiconductor module. Therefore, high cooling performance is ensured. Also, the strut fixing part, to which the strut is fixed, is prevented from being deformed, thus realizing high dimensional accuracy.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

A mode for carrying out the present invention will be explained below with reference to the accompanying drawings FIG. 1 to FIG. 8 stated above. Known matters such as materials of constituents are omitted as necessary, and matters related to the present invention will be explained chiefly.

Figure 1:
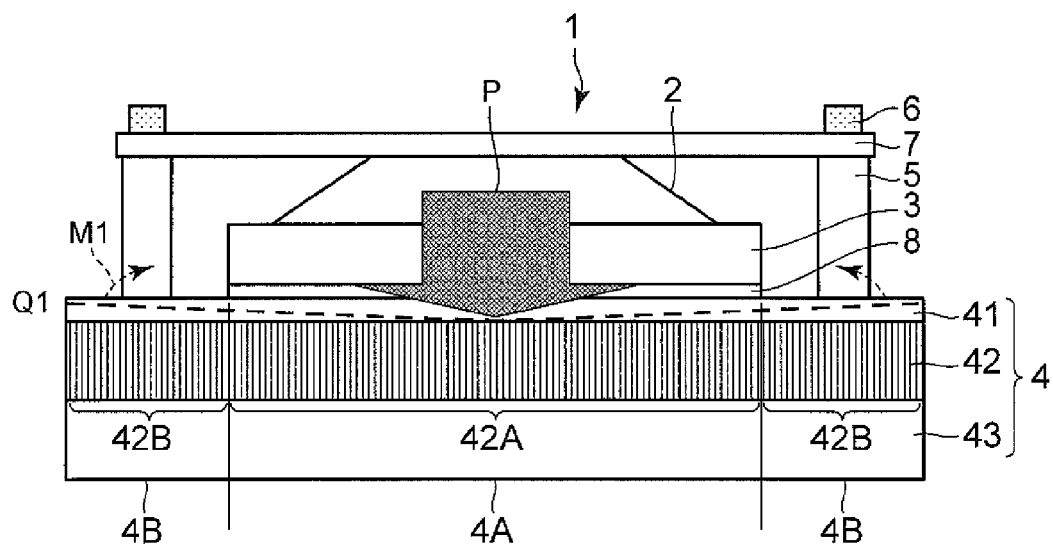
FIG. 1 is a schematic view showing a rough configuration of a semiconductor device according to an embodiment of the present invention.

As shown in FIG. 1, a semiconductor device 1 according to the embodiment includes a spring 2 (a spring member) that is a coned disc spring, a flat plate-shaped semiconductor module 3, a cooler 4, struts 5, bolts 6, and a beam member 7. The cooler 4 includes an upper plate 41, a cooling fin 42, and a lower plate 43.

The cooler 4 has a pressed part 4A, and strut fixing parts 4B. The semiconductor module 3 is placed on the pressed part 4A, and the pressed part 4A is pressed downwardly from the top as in FIG. 1. On the strut fixing parts 4B, the semiconductor module 3 is not placed, but the struts 5 are fixed to the strut fixing parts 4B, respectively. In the semiconductor module 3, a semiconductor element (not shown) is covered by a synthetic resin. Although details are not shown, a metal foil or a metal plate is mounted on a lower side of a collector through an insulating resin, and the metal plate constitutes a lower surface of the semiconductor module 3.

The struts 5 are fixed to the strut fixing parts 4B where the semiconductor module 3 is not positioned, in other words, to an upper surface of the upper plate 41, by a method such as caulking. Internal threads corresponding to external threads of the bolts 6 are drilled in upper surfaces of the struts 5.

A side of the spring 2 with a larger area faces an upper surface of the semiconductor module 3 shown in FIG. 1, and a side of the spring 2 with a smaller area faces a lower surface of the beam member 7. The bolts 6 are inserted thorough bolt holes (not shown) of the beam member 7, and screwed into the foregoing internal threads positioned in the upper surfaces of the struts 5. Thus, the beam member 7 is connected with and fixed to the struts 5. The spring 2 or the spring member may have any form or material as long as the spring 2 or the spring member is a member with elasticity.

As the beam member 7 is connected with the struts 5, the beam member 7 is displaced in a direction towards the upper plate 41 of the cooler 4. Based on the displacement, the spring 2 is compressed, and generates pressure force P. Because of the pressure force P, the semiconductor module 3 is pressed against the upper plate 41. Grease 8 is mounted between the lower surface of the semiconductor module 3 and the upper plate 41. The grease 8 is heat dissipation grease such as heat dissipation silicon, and has a function of ensuring heat conductivity between the lower surface of the semiconductor module 3 and the upper plate 41.

Figure 2:
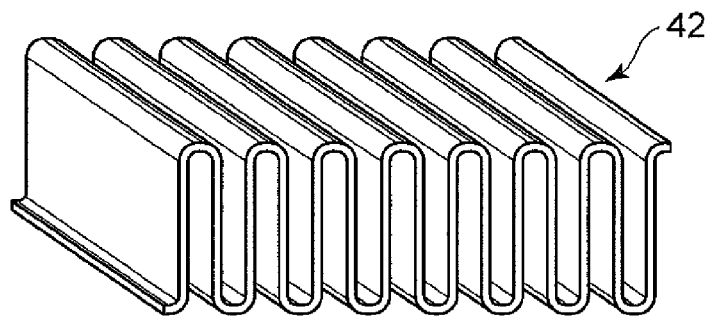
FIG. 2 is a schematic view showing a specific embodiment of a cooling fin included in the semiconductor device according to the embodiment.

The strut fixing parts 4B shown in FIG. 1 are set to have higher rigidity than the pressed part 4A. The cooling fin 42 shown in FIG. 1 has, for example, a bellows shape as shown in FIG. 2. In this embodiment, a direction in which a curved line of the cooling fin 42 shaped like a bellows extends is a depth direction in FIG. 1. Therefore, boundary lines between a strut fixing parts 4B and a pressed part 4A also extend in the depth direction. This means that regions of the strut fixing parts 4B, and a region of the pressed part 4A are distinguished in a width direction in FIG. 1.

Figure 3:
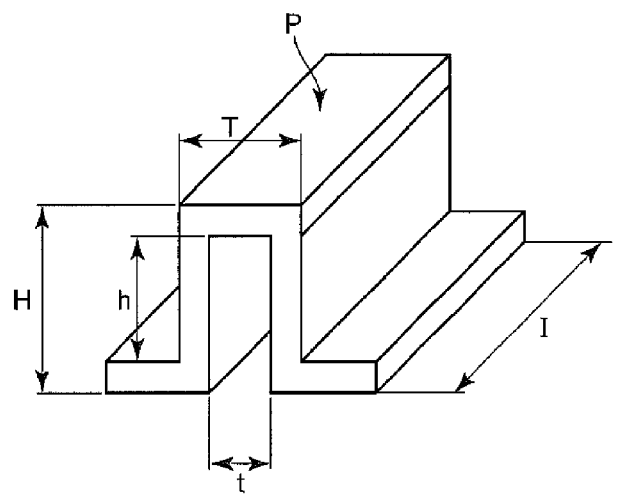
FIG. 3 is a schematic view showing a specific method for making rigidity of a strut fixing part different from rigidity of a pressed part of a cooler in the semiconductor device according to the embodiment.

In this embodiment, when the rigidity is set, dimensional data of the cooling fin 42 is adjusted. In other words, for the cooling fin 42A located in the region corresponding to the pressed part 4A, and the cooling fin 42B located in the region corresponding to the strut fixing part 4B, different dimensions are set for each dimensional data shown in FIG. 3. FIG. 3 shows a form of the cooling fin 42 per pitch.

The parameters shown in FIG. 3 include T (the sum of a fin gap t and a fin plate thickness), t (a fin gap), H (a fin height), h (a fin height—a fin plate thickness), and l (a fin length). Where E is Young's modulus of the fin, and I is a second moment of area, $I \propto TH^3 - th^3$ is true. Where P is a load (pressure force), and $\delta$ is displacement, $\delta \propto Pl^3/EI^2$ is true. "$\propto$" means "proportional".

This means that, in the cooling fin 42B, the fin length l is set to be longer than a fin length l of the cooling fin 42A, and Young's modulus E is set to be smaller than Young's modulus E of the cooling fin 42A. For setting of Young's modulus E, an appropriate method like changing materials or thermal refining such as quenching is used.

In the cooling fin 42B, T, which is the sum of the fin gap t and the fin plate thickness, is made smaller than that of the cooling fin 42A so that the second moment of area I is made smaller than the second moment of area I of the cooling fin 42A. As shown in FIG. 3, "T, which is the sum of the fin gap t and the fin plate thickness" corresponds to a "value obtained by adding the fin gap t to doubled fin plate thickness". In this embodiment, since both the upper plate 41 and the lower plate 43 have a flat plate shape, the fin height H, and the fin height—the fin plate thickness h are not adjusted.

Figure 4:
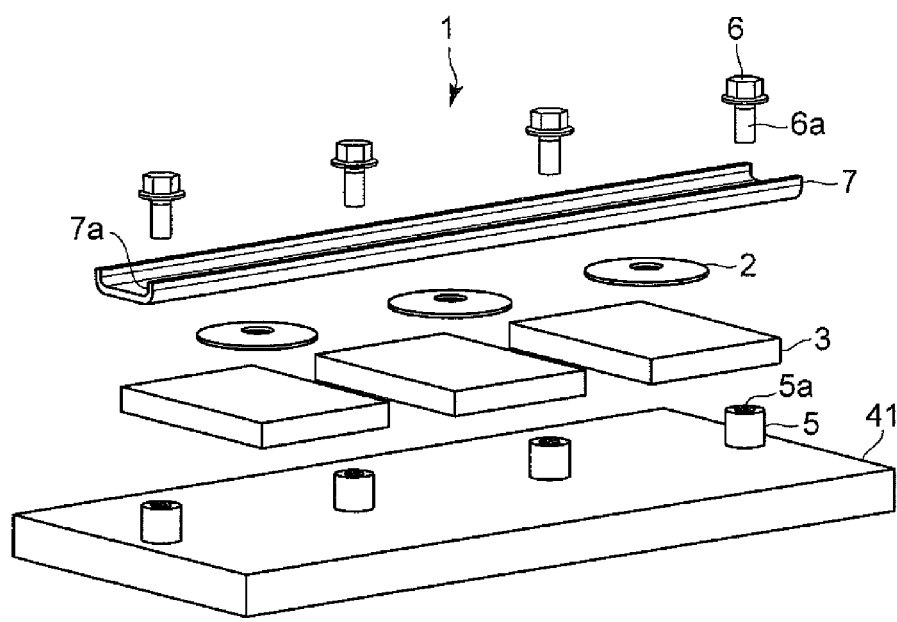
FIG. 4 is a schematic view showing constituents included in an entire configuration of the semiconductor device according to the embodiment, the constituents being arranged in line.

The arrangement form of the semiconductor module 3 and the struts 5 of the semiconductor device 1 shown in FIG. 1 stated above is described as an example related to one of the semiconductor modules 3. In consideration of packaging density, ease of configuring a beam member 7, and so on, three semiconductor modules 3 may be arranged in line with respect to one beam member 7, and a strut 5 may be arranged at four locations between and outside the semiconductor modules 3, as shown in FIG. 4.

In this case, bolt holes 7a are formed in the beam member 7, and four bolts 6 corresponding to the struts 5 at the four locations are inserted through the bolt holes 7a. Springs 2 are arranged between the semiconductor modules 3 and the beam member 7, respectively.

Internal threads 5a, with which external threads 6a are screwed, are drilled in upper sides of the struts 5. The struts 5 may be fixed to an upper surface of the upper plate 41 by calking. The struts 5 may be integrally formed with the upper surface of the upper plate 41 in advance. The struts 5 are arranged at four locations at equal intervals in the upper surface of the upper plate 41 in a direction in which the semiconductor modules 3 are arranged in line.

The three semiconductor modules 3 are arranged between the four struts 5. A surface of the spring 2 on a side with a larger area is mounted on the upper surface of each of the three semiconductor modules 3, and the beam member 7 is mounted on a surface of each of the three springs 2 on a side with a smaller area. Thereafter, the bolts 6 are inserted through the bolt holes 7a in the beam member 7, and the external threads 6a of the bolts 6 are screwed into the internal threads 5a in the struts 5. Thus, the semiconductor device 1 shown in FIG. 5 is formed.

Figure 5:
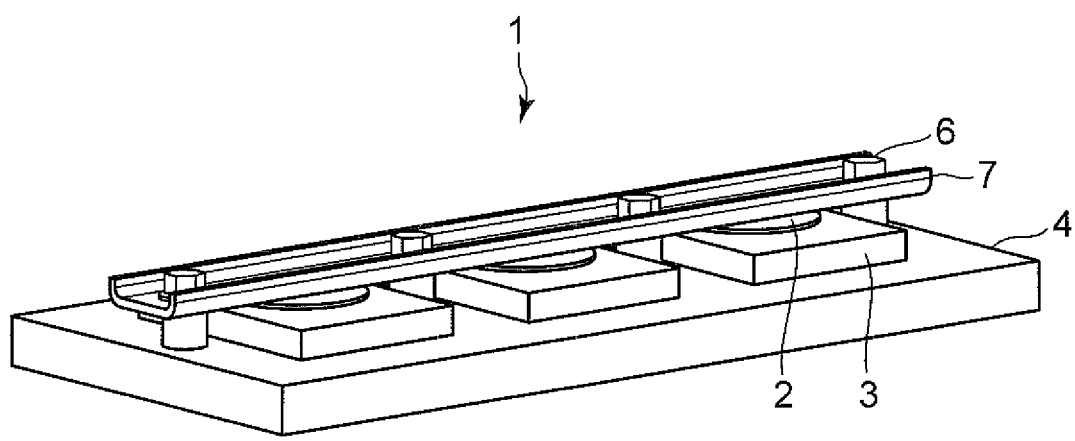
FIG. 5 is a schematic view showing the entire configuration of the semiconductor device according to the embodiment.
Figure 6A:
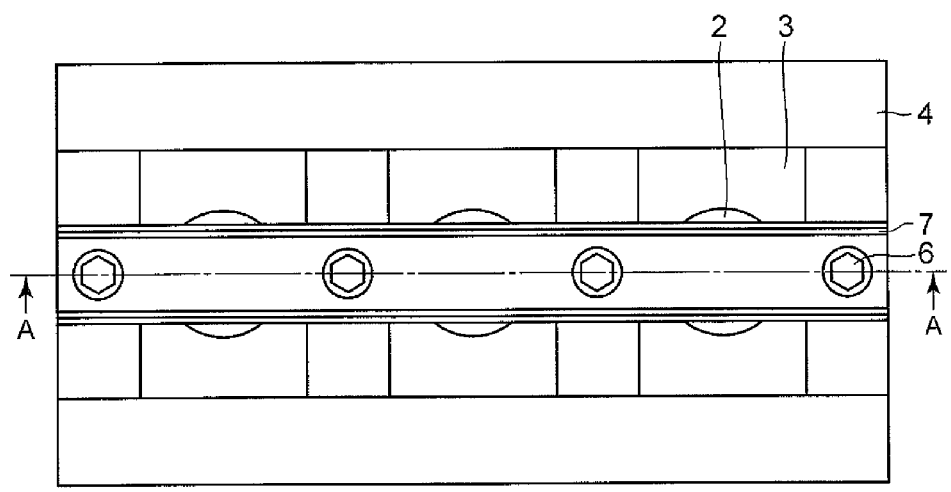
FIG. 6A and FIG. 6B are schematic views showing the entire configuration of the semiconductor device according to the embodiment, and also showing a position of a section, and constituents inside the section.
Figure 6B:
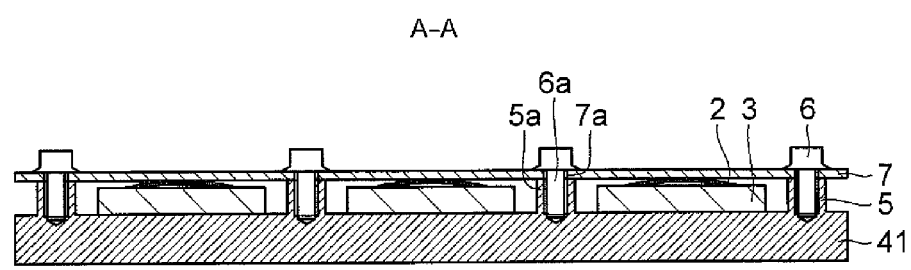

FIG. 6A is a top view of the completed semiconductor device 1 shown in FIG. 5. FIG. 6B shows a section taken along the line A-A in the top view in FIG. 6A. As for the semiconductor modules 3, only a resin, which forms a molding covering the semiconductor device, is shown for convenience of illustration. In other words, axial tension due to screwing the external threads 6a of the four bolts 6 into the internal threads 5a of the struts 5 is accumulated in the springs 2, and pressure force P is generated for pressing the semiconductor modules 3 against the upper surface of the upper plate 41 of the cooler 4.

According to the semiconductor device 1 of this embodiment stated above, the following effects are obtained. The external threads 6a of the bolts 6 are screwed into the internal threads 5a of the struts 5, and the springs 2 are compressed by the beam member 7. Thus, the semiconductor device 1 is completed, and the pressure force P is generated. In a state where the pressure force P is acting, a boundary surface between the upper plate 41 and the cooling fin 42 is easily deformed as shown by a broken line Q1 in FIG. 1, in the cooling fin 42A that belongs to the pressed part 4A located below the lower surface of the semiconductor module 3. Therefore, capability of following deformation is ensured in the boundary surface between the upper plate 41 and the cooling fin 42.

As shown in FIG. 1, in the state where the semiconductor device 1 is completed, the grease 8 is arranged between the upper surface of the upper plate 41 of the cooler 4, and the lower surface of the semiconductor module 3. Prior to assembly during which the pressure force P acts, the grease 8 is arranged as dots near the center of the upper surface of the upper plate 41, or in a matrix. In this embodiment, as the pressure force P acts evenly on the surface based on following capability of the cooling fin 42A, the grease 8 is distributed into a flat plate shape, and evenly and thinly over the entire lower surface of the semiconductor module 3, as shown in FIG. 1. Thus, cooling performance is enhanced.

Figure 7:
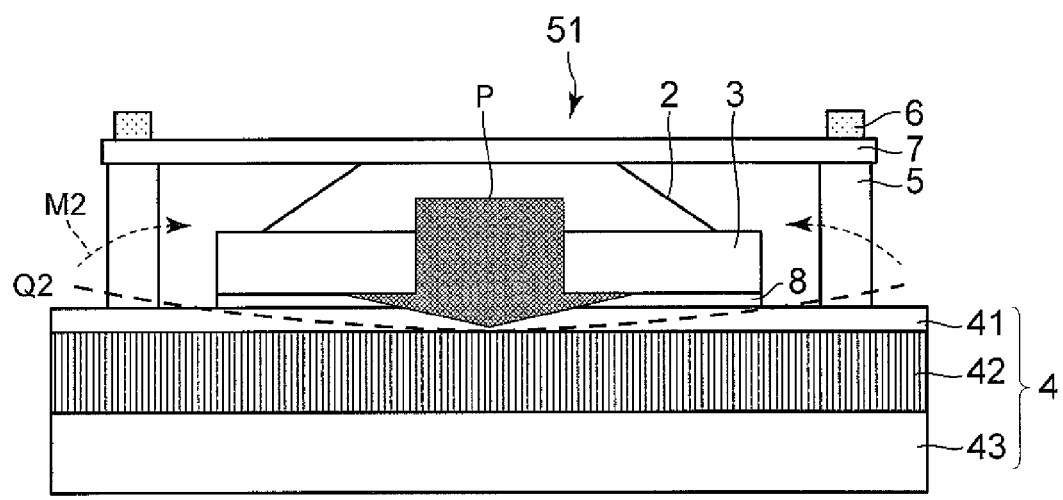
FIG. 7 is a schematic view showing a semiconductor device according to the related art.

In this embodiment, high rigidity is set for the cooling fin 42B that belongs to the strut fixing part 4B in which the strut 5 is located, and the cooling fin 42B is thus difficult to be deformed as shown in both ends of the broken line Q1 in FIG. 1. FIG. 7 shows a semiconductor device 51 according to the related art. In the semiconductor device 51 according to the related art, rigidity of a cooling fin 42 located below a strut 5 is equal to rigidity of the cooling fin 42 located below a semiconductor module 3. Therefore, as shown by a broken line Q2 in FIG. 7, an amount of deformation below the strut 5 is increased.

Therefore, it is possible that tilts of the struts 5 shown by M1 in FIG. 1 are smaller than tilts of the struts 5 shown by M2 in FIG. 7. In other words, in this embodiment, it is possible to ensure accuracy in position and height of the upper surface that is constituted by the beam member 7 and head portions of the bolts 6 in the semiconductor device 1.

The preferred embodiment of the present invention has been explained in detail. However, the present invention is not limited to the foregoing embodiment, and various deformation and replacements may be added to the foregoing embodiment without departing from the scope of the present invention.

Figure 8:
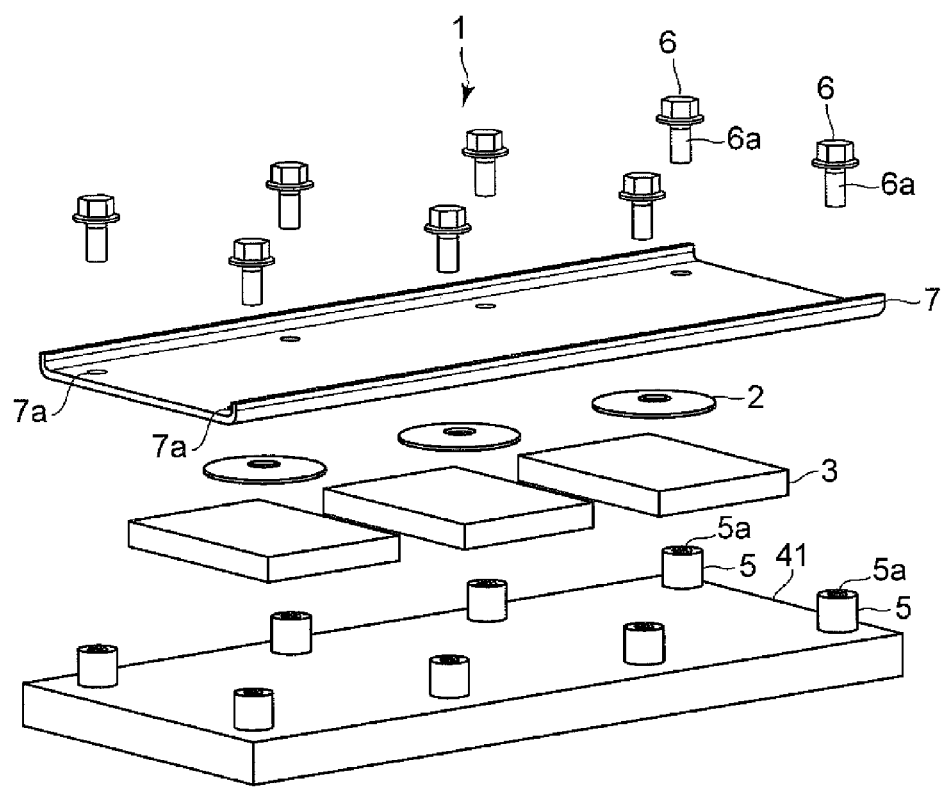
FIG. 8 is a schematic view showing a modification of the semiconductor device according to the embodiment of the present invention.

For example, in the semiconductor device 1 according to the embodiment shown in FIG. 4 to FIG. 5, the struts 5 are arranged in one row and four lines on the upper surface of the upper plate 41. However, the struts 5 may be arranged in two rows and four lines as shown in FIG. 8. In this case, a beam member 7 in FIG. 8 is longer than the beam member 7 shown in FIG. 4 in the depth direction.

The present invention relates to a semiconductor device, and, grease is arranged evenly and more thinly on a surface between a cooler and a semiconductor module by enhancing capability of the cooler for following pressing of a pressed part. Thus, the present invention is able to ensure higher cooling performance.

The present invention is able to realize high dimensional accuracy by preventing deformation of the strut fixing part to which the strut is fixed. Therefore, it is beneficial to apply the present invention to various semiconductor-related devices. It is naturally beneficial to apply the present invention to semiconductor devices that are applied to inverters and so on of different kinds of vehicles such as a passenger vehicle, a track, and a bus.

What is claimed is:

1. A semiconductor device, comprising:
   a semiconductor module;
   a cooler;
   a spring member configured to press the semiconductor module against the cooler;
   a strut fixed to the cooler; and
   a beam member that is connected with the strut and configured to compress the spring member, wherein
   the cooler includes a pressed part to which the semiconductor module is pressed, and a strut fixing part to which the strut is fixed, and
   the strut fixing part has higher rigidity than the pressed part.

2. The semiconductor device according to claim 1, wherein
   the cooler includes a cooling fin, and
   dimensional data of a part of the cooling fin located in a region corresponding to the strut fixing part is different from dimensional data of a part of the cooling fin located in a region corresponding to the pressed part.

3. The semiconductor device according to claim 1, wherein
   the cooler includes a cooling fin;
   the cooling fin includes a first cooling fin corresponding to the pressed part, and a second cooling fin corresponding to the strut fixing part, and
   a shape of the first cooling fin is different from a shape of the second cooling fin.

4. The semiconductor device according to claim 3, wherein
   the cooling fin has a bellows shape having a plurality of gaps in a plane perpendicular to a lamination direction of the semiconductor device, and
   a length of the second cooling fin is larger than a length of the first cooling fin in a direction perpendicular to a width direction of the gaps on the plane.

5. The semiconductor device according to claim 4, wherein
   a sum of a gap of the second cooling fin and a thickness of a plate that constitutes the second cooling fin is smaller than a sum of a gap of the first cooling fin and a thickness of a plate that constitutes the first cooling fin.

* * * * *